United States Patent
Kim (10) Patent No.: US 9,660,178 B2
(45) Date of Patent: May 23, 2017

(54) ELECTRONIC DEVICE AND METHOD FOR FABRICATING THE SAME

(71) Applicant: SK hynix Inc., Icheon-Si (KR)

(72) Inventor: Jae-Hong Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 231 days.

(21) Appl. No.: 14/685,446

(22) Filed: Apr. 13, 2015

(65) Prior Publication Data

US 2016/0155933 A1   Jun. 2, 2016

(30) Foreign Application Priority Data

Nov. 27, 2014   (KR) .......................... 10-2014-0167208

(51) Int. Cl.
| | |
|---|---|
| *H01L 43/08* | (2006.01) |
| *H01L 43/02* | (2006.01) |
| *G06F 13/40* | (2006.01) |
| *G06F 3/06* | (2006.01) |
| *G06F 12/0802* | (2016.01) |
| *H01L 43/12* | (2006.01) |
| *H01L 45/00* | (2006.01) |

(52) U.S. Cl.
CPC ............ *H01L 43/08* (2013.01); *G06F 3/0604* (2013.01); *G06F 3/0655* (2013.01); *G06F 3/0688* (2013.01); *G06F 12/0802* (2013.01); *G06F 13/4027* (2013.01); *H01L 43/02* (2013.01); *H01L 43/12* (2013.01); *G06F 2212/2024* (2013.01); *G06F 2212/222* (2013.01); *H01L 45/04* (2013.01); *H01L 45/06* (2013.01); *H01L 45/1233* (2013.01); *H01L 45/1253* (2013.01); *H01L 45/16* (2013.01)

(58) Field of Classification Search
CPC . H01L 45/145; H01L 45/124; H01L 45/1246; H01L 45/1608; H01L 45/146; H01L 45/1233; H01L 45/1675; H01L 45/1625; H01L 45/08; H01L 27/2436; H01L 27/2481; H01L 27/2409
USPC ................... 257/2, 4; 438/104, 382; 365/148
See application file for complete search history.

(56) References Cited

U.S. PATENT DOCUMENTS

2015/0171324 A1\*   6/2015   Mikawa .............. H01L 27/1021
257/4

FOREIGN PATENT DOCUMENTS

KR   10-2015-0102302 A   9/2015

\* cited by examiner

*Primary Examiner* — Thomas L Dickey
*Assistant Examiner* — Changhyun Yi
(74) *Attorney, Agent, or Firm* — Perkins Coie LLP (57) ABSTRACT

Provided is an electronic device. The electronic device according to an implementation of the disclosed technology includes a semiconductor memory, the semiconductor memory including: a substrate; an interlayer insulating layer formed over the substrate; a metal-containing insulating layer formed over the interlayer insulating layer and including a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material including a first metal, and the second metal has a higher electron affinity than the first metal.

15 Claims, 8 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2014-0167208, entitled "ELECTRONIC DEVICE AND METHOD FOR FABRICATING THE SAME" and filed on Nov. 27, 2014, which is incorporated herein by reference in its entirety.

BACKGROUND

This patent document relates to memory circuits or devices and their applications in electronic devices or systems.

Recently, as electronic devices or appliances trend toward miniaturization, low power consumption, high performance, multi-functionality, and so on, there is a demand for electronic devices capable of storing information in various electronic appliances such as a computer, a portable communication device, and so on and research and development for such electronic devices have been conducted. Examples of such electronic devices can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which has improved reliability.

In one aspect, an electronic device is provided to include a semiconductor memory that includes: a substrate; an interlayer insulating layer formed over the substrate; a metal-containing insulating layer formed over the interlayer insulating layer and including a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material including a first metal, and the second metal has a higher electron affinity than the first metal. In some implementations, the electronic device may further include a spacer on a sidewall of the variable resistance element. In some implementations, the spacer may include the same material as the metal-containing insulating layer.

In some implementations, a sidewall of the contact plug may be in contact with the interlayer insulating layer; and the sidewall of the contact pad may be in contact with the interlayer insulating layer and the metal-containing insulating layer. In some implementations, the contact pad may extend to have a protruding portion from the contact hole. In some implementations, a width of the variable resistance element may be smaller than that of the contact pad. In some implementations, reactivity between the second metal and oxygen may be greater than that between the first metal and oxygen. In some implementations, the first metal may include a transition metal; and the second metal may include an amphoteric elements or a lanthanoid element. In some implementations, the variable resistance element may include a magnetic tunnel junction having a tunnel barrier interposed between two magnetic materials. In some implementations, the variable resistance element may include a metal oxide, a phase-change material or a ferroelectric material.

In some implementations, the electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device is provided. The method may include: forming an interlayer insulating layer having a contact hole over a substrate; forming a contact plug so as to fill a portion of the contact hole; forming a contact pad over the contact plug so as to fill the remaining portion of the contact hole; forming an oxidized contact pad over the contact pad by oxidizing the contact pad; forming a reduced layer over a structure including the oxidized contact pad; performing annealing to reduce the oxidized contact pad to the contact pad and to convert the reduced layer to an insulting layer; removing the insulting layer over the contact pad; and forming a variable resistance element over the contact pad.

In some implementations, the forming of the oxidized contact pad may include: forming a metal-containing material over the interlayer insulating layer so as to fill the remaining portion of the contact hole; and performing a planarization process on the metal-containing material until the interlayer insulating layer is exposed. In some implementations, the performing of the planarization process may include using a chemical mechanical polishing method. In some implementations, the contact pad may include a first metal-containing layer containing a first metal; the oxidized contact pad may include a metal oxide layer formed by oxidation of the first metal-containing layer; and the reduced layer may include a second metal-containing layer including a second metal, wherein the second metal has a higher electron affinity than the first metal. In some implementations, the contact pad may include a first metal-containing layer containing a first metal; the oxidized contact pad may include a metal oxide layer formed by oxidation of the first metal-containing layer; and the reduced layer may include a second metal-containing layer including a second metal, wherein reactivity between the second metal and oxygen may be greater than that between the first metal and oxygen. In some implementations, the second material may have insulation properties when oxidized. In some implementations, the first metal may include a transition metal, and the second metal may include an amphoteric element or a lanthanoid element. In some implementations, the performing of the annealing may include: reducing the oxidized contact pad, which is in contact with the reduced layer, to the contact pad in an inert gas atmosphere; and converting the reduced layer to the insulating layer in an oxygen gas atmosphere. In some implementations, the removing of the insulating layer may be performed such that the insulating layer over the interlayer insulating layer remains to have a predetermined thickness, and the surface of the insulating layer is even with the contact pad.

In some implementations, the forming of the variable resistance element over the contact pad includes forming a spacer on a sidewall of the variable resistance element. In some implementations, the spacer may be formed by re-deposition of the insulating layer on the sidewall of the variable resistance element during the forming of the variable resistance element.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementation of the disclosed technology relates to an electronic device including a semiconductor memory having improved reliability and a fabrication method thereof. The semiconductor memory in accordance with the implementation will be described with reference to an example in which a variable resistance element is used as a storage element. Herein, the improved reliability for the semiconductor memory may be meant to include improved stability for the process of forming the variable resistance element and improved characteristics (or performance) of the variable resistance element.

For example, the variable resistance element can be configured to be switchable between different resistance states in response to a bias (e.g., a current or voltage) applied thereto. The variable resistance element may include variable resistance material used in a resistive memory in which information is stored and erased depending on a change of resistance characteristics. The variable resistance materials may include various materials used in RRAM, PRAM, FRAM, MRAM, or STTRAM, etc. For example, the variable resistance materials may include ferromagnetic materials, insulating metal oxides including insulating transition metal oxide materials and perovskite-based materials, insulating phase-change materials including chalcogenide-based materials, or insulating ferroelectric materials, etc.

Hereinafter, for convenience of explanations, implementations of the disclosed technology will be described by way of an example of a magnetic tunnel junction (MTJ) having a tunnel barrier interposed between two magnetic materials to produce different junction resistance values depending on the relative magnetic directions of the two magnetic materials. In implementations, the disclosed technology can be applied to various variable resistance elements while not being limited to the magnetic tunnel junction.

Figure 1:
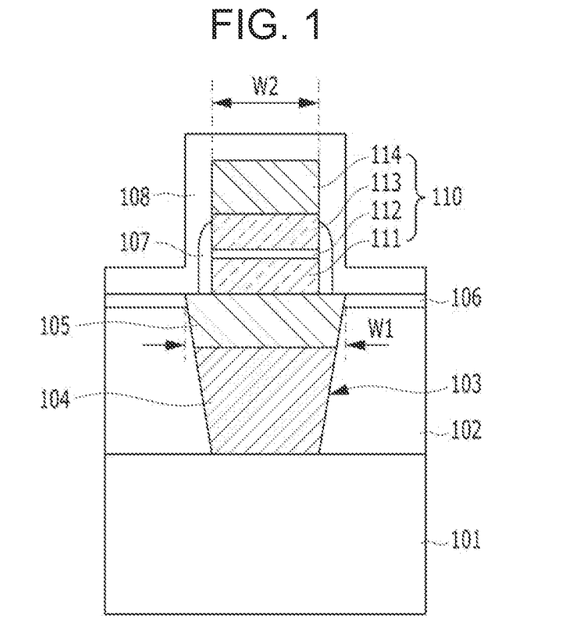
FIG. 1 is a cross-sectional view showing a semiconductor memory in accordance with an implementation of the disclosed technology.

FIG. 1 is a cross-sectional view showing a semiconductor memory in accordance with an implementation of the disclosed technology.

As shown in FIG. 1, an electronic device according to an implementation of the disclosed technology may include: an interlayer insulating layer 102 over a substrate 101 having a predetermined structure; a metal-containing insulating layer 106 formed on or over interlayer insulating layer 102 and containing a second metal; a contact hole 103 formed through both the interlayer insulating layer 102 and the metal-containing insulating layer 106; a contact plug 104 filling a portion of the contact hole 103; a contact pad 105 formed on or over the contact plug 104 so as to fill the remaining portion of the contact hole 103, the contact pad 105 including a metal-containing material containing a first metal; a variable resistance element 110 formed over the contact pad 105; a spacer 107 formed on the side wall of the variable resistance element 110; and a capping layer 108 which covers the variable resistance element 110 including the spacer 107.

The substrate 101 may be or include a semiconductor substrate. The semiconductor substrate may be in a single crystal state and may include a silicon-containing material. In other words, the semiconductor substrate may include a single-crystalline silicon-containing material. For example, the substrate 101 may be or include a bulk silicon substrate, or a SOI (Silicon On Insulator) substrate composed of or including a support substrate, a buried insulating layer and a single-crystalline silicon layer, which are sequentially deposited in that order.

The predetermined structure formed on or over the substrate 101 may include a switching element (not shown). The switching element is connected to one end of the variable resistance element 110 and serves to control the supply of a bias to the variable resistance element 110. The switching element may include a transistor or a diode, etc. The switching element may be electrically connected to the contact plug 104 at one end of the switching element and to a conductive line, e.g., a source line (not shown), at the other end of the switching element.

Interlayer insulating layer 102 may be composed of or include any one or a combination of two or more selected from the group consisting of or including an oxide layer, a nitride layer and/or an oxynitride layer. Metal-containing insulating layer 106 over interlayer insulating layer 102 is used to realize a low resistance contact pad 105, and to eliminate the step difference between contact pad 105 and interlayer insulating layer 102. To realize low resistance contact pad 105, metal-containing insulating layer 106 may include a metal oxide formed by oxidizing the second metal. Examples of the second metal may include amphoteric elements such as Al, Zn, Ga, In, Sn or the like, or lanthanoids. For example, metal-containing insulating layer 106 may be or include an aluminum oxide layer ($Al_2O_3$).

Contact plug 104 may be formed such that the top surface of the contact plug 104 is located below the top surface of interlayer insulating layer 102, the top surface of metal-containing insulating layer 106 or the inlet portion of contact hole 103. This enables to provide a space in which contact pad 105 is to be formed and easily form contact pad 105 having a flat surface. Contact plug 104 may include a metal-containing material having excellent filling characteristics and a high electrical conductivity. For example, contact plug 104 may include tungsten (W), or titanium nitride (TiN), etc.

The sidewall of contact plug 104 filling a portion of contact hole 103 may be in contact with interlayer insulating layer 102. In addition, the sidewall of contact pad 105 formed on or over contact plug 104 and filling the remaining portion of contact hole 103 may be in contact with interlayer insulating layer 102 and metal-containing insulating layer 106.

Contact pad 105 may include a variety of material layers for various purposes including improving the characteristics of variable resistance element 110, making the process easier, providing an electrode for variable resistance element 110, or reducing the contact resistance between contact plug 104 and variable resistance element 110. Contact pad 105 may include a metal-containing material containing a first metal. The first metal may include a transition element. To provide low resistance contact pad 105, the first metal may have a lower electron affinity than the second metal. For example, reactivity between the first metal and oxygen may be lower than that between the second metal and oxygen. For example, when metal-containing insulating layer 106 is or includes an aluminum oxide layer, contact pad 105 may be or include tantalum (Ta)-containing material. For example, contact pad 105 may be or include a tantalum layer. The relation between the first and second metals will be further described in detail later with respect to the following fabrication method.

Variable resistance element 110 may include a magnetic tunnel junction having a tunnel barrier 112 interposed between two magnetic materials. More specifically, variable resistance element 110 may include a first magnetic material 111, a tunnel barrier 112, a second magnetic material 113 and a top electrode 114. As one example, in this implementation, variable resistance element 110 does not have any additional bottom electrode and contact pad 105 acts as a bottom electrode of variable resistance element 110. The first magnetic material 111 and the second magnetic material 113 may include a ferromagnetic material. More specifically, the first magnetic material 111 and the second magnetic material 113 may include alloys based on Fe, Ni or Co, for example, a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, a Fe—Pd alloy, a Co—Pd alloy, a Co—Pt alloy, a Fe—Ni—Pt alloy, a Co—Fe—Pt alloy and/or a Co—Ni—Pt alloy. Any one of the first magnetic material 111 and the second magnetic material 113 may be used as a pinned layer whose magnetization direction is fixed, and the other one may be used as a free layer whose magnetization direction is changed. Tunnel barrier 112 functions to convert the magnetization direction of the free layer through tunneling of electrons. Tunnel barrier 112 may include oxides such as MgO, CaO, SrO, TiO, VO or NbO.

Variable resistance element 110 formed on or over contact pad 105 may overlap with contact pad 105 in a vertical direction, and the width (W2) of variable resistance element 110 may be smaller than that the width (W1) of contact pad 105. The whole variable resistance element 110 may be located over contact pad 105 having a flat surface. Since the layer of tunnel barrier 112 is present on or over the flat surface, it is possible to secure magnetic tunnel junction characteristics. For the reference, if the width (W2) of variable resistance element 110 is greater than the width (W1) of contact pad 105, the layer of tunnel barrier 112 will be bent around the boundary between contact pad 105 and metal-containing insulating layer 106, and thus the characteristics of the magnetic tunnel junction will be deteriorated.

Spacer 107 on or over the sidewall of variable resistance element 110 may be formed to cover the whole sidewall of variable resistance element 110 or to cover the lower portion of sidewall of variable resistance element 110. Spacer 107 may include the same material as that of metal-containing insulating layer 106. Spacer 107 may be formed by re-deposition of metal-containing insulating layer 106 on or over the sidewall of variable resistance element 110 in the process of forming variable resistance element 110. Capping layer 108 for covering variable resistance element 110 including spacer 107 may include an insulating material.

Because the electronic device in accordance with the implementation has metal-containing insulating layer 106, low resistance contact pad 105 can be easily realized, and the stability of the process of forming variable resistance element 110, and the characteristics of variable resistance element 110 can be improved. In other words, the reliability of the electronic device according to the implementation can be improved.

FIG. 2A to 2F are cross-sectional views showing a semiconductor memory fabrication method in accordance with an implementation of the disclosed technology.

Figure 2A:
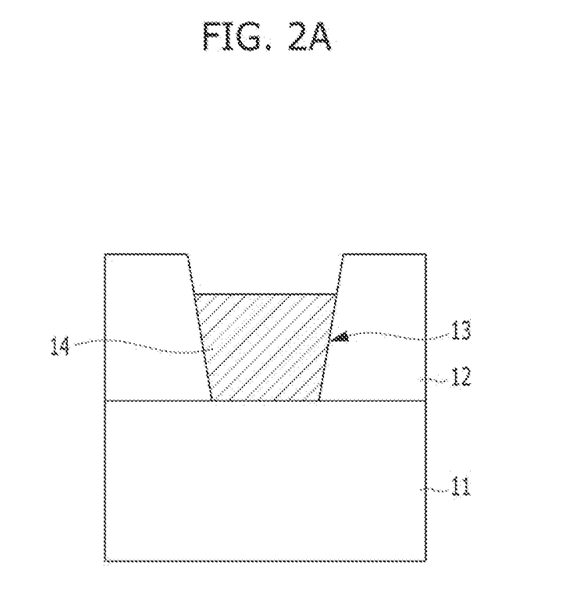
FIG. 2A to 2F are cross-sectional views showing a semiconductor memory fabrication method in accordance with an implementation of the disclosed technology.

As shown in FIG. 2A, interlayer insulating layer 12 is formed over a substrate 11 having a predetermined structure, e.g., a switching element (not shown). Interlayer insulating layer 12 may be composed of or include any one or a combination of two or more selected from the group consisting of or including an oxide layer, a nitride layer and/or an oxynitride layer.

Next, interlayer insulating layer 12 is selectively etched to expose a portion of substrate 11, thus forming contact hole 13. Then, contact plug 14 is formed so as to fill a portion of contact hole 13. Contact plug 14 that fills a portion of contact hole 13 may be formed such that the top surface of contact plug 14 is lower than the top surface of interlayer insulating layer 12 or the inlet portion of contact hole 13. Electrical conductive material may be deposited over the surface of substrate 11 in a manner to fill contact hole 13, and then a planarization process and blanket etch process are sequentially preformed to form contact plug 14. Contact plug 14 may include a metal-containing material having excellent filling characteristics and a high electrical conductivity. For example, contact plug 14 may include tungsten (W) or titanium nitride (TiN), etc.

Figure 2B:
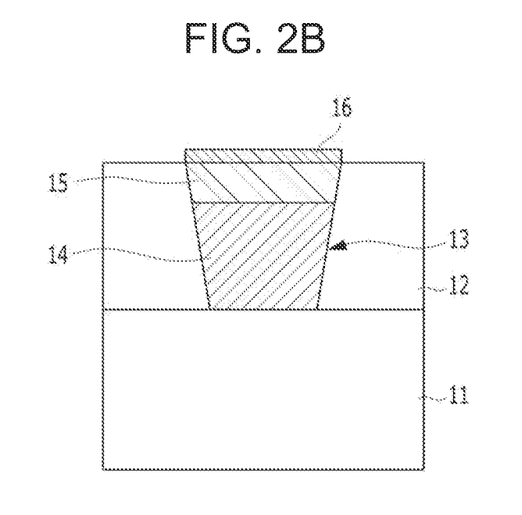

As shown in FIG. 2B, contact pad 15 is formed on or over contact plug 14 so as to fill the remaining portion of contact hole 13. Contact pad 15 may include a variety of material layers for various purposes including providing a bottom electrode of a variable resistance element to be formed over contact pad 15 through a subsequent process, improving the characteristics of variable resistance element 22, or allowing a process to be easier, etc. Herein, for the purpose of improving the characteristics of variable resistance element 22, contact pad 15 may include a metal-containing material including a first metal, wherein the first metal may include a transition element. For example, contact pad 15 may be or include a tantalum (Ta)-containing layer. For example, contact pad 15 may be or include a tantalum layer.

Contact pad 15 may be formed by forming a metal-containing layer over the surface of substrate 11 so as to fill the remaining portion of contact hole 13, and then performing a planarization process on or over the metal-containing layer until the surface of interlayer insulating layer 12 is exposed. Herein, the planarization process is performed to realize electrical isolation between adjacent contact pads 15 and provide the flat surface of contact pad 15, and may be performed by a chemical mechanical polishing method. Because variable resistance element 22 is formed over contact pad 15 through a subsequent process, excellent characteristics of variable resistance element 22 may be secured as the surface flatness of contact pad 15 increases. For example, it is known in semiconductor fabrication technology that a chemical mechanical polishing method is often the preferred method for embodying a flat surface while other techniques may also be used. In a planarization process for forming contact pad 15, e.g., a chemical mechanical polishing process, contact pad 15 is oxidized to form oxidized contact pad 16 over the surface of contact pad 15. That is, a metal oxide layer is formed over the surface of contact pad 15 by oxidation of the first metal. For example, when contact pad 15 is or includes a tantalum layer, a tantalum oxide layer ($Ta_2O_5$) is formed as oxidized contact pad 16 over contact pad 15 at the completion of the planarization process. This is because polishing is performed in such a manner that the chemical mechanical polishing of metal-containing material oxidizes the surface of metal-containing material by slurry to form an oxide and the oxide formed on the surface is removed.

Oxidized contact pad 16 formed over contact pad 15 may increase resistance of contact pad 15 itself or increase contact resistance between variable resistance element to be formed by the following process and contact pad 15. Therefore, oxidized contact pad 16 need to be removed prior to forming variable resistance element. However, techniques of removing oxidized contact pad such as etching or cleaning may also increase roughness of the surface of contact pad 15 or induce a step difference between contact pad 15 and interlayer insulating layer 12, thereby degrading the characteristics of variable resistance element 22.

Figure 2C:
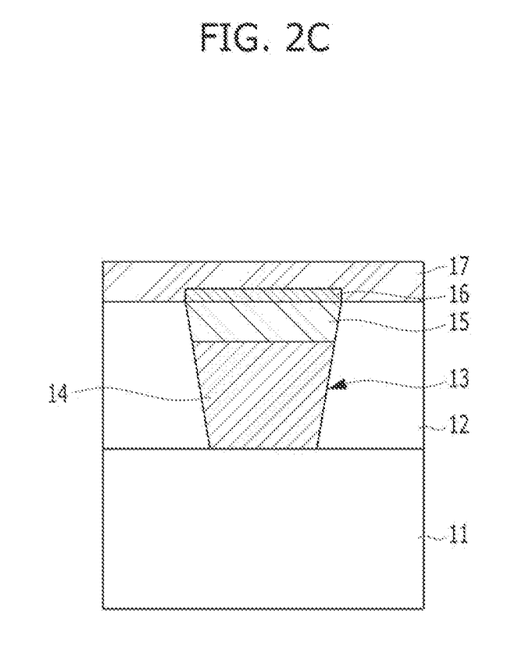

As shown in FIG. 2C, a reduced layer 17 is formed over the surface of structure including oxidized contact pad 16. The reduced layer 17 is designed to reduce oxidized contact pad 16 to contact pad 15 without lowering the flatness and introducing step difference of the surface of contact pad 15. Reduced layer 17 may be formed to include the second metal-containing layer containing or including the second metal. The second metal may be or include a metal having electron affinity higher than the first metal so as to reduce oxidized contact pad 16 to contact pad 15. For example, the reactivity between the second metal and oxygen may be higher than the reactivity between the first metal and oxygen. The second metal is selected such that oxide of the second metal exhibits insulation properties. For example, when the first metal is or includes a transition metal, the second metal may include an amphoteric element or a lanthanoid element.

Figure 2D:
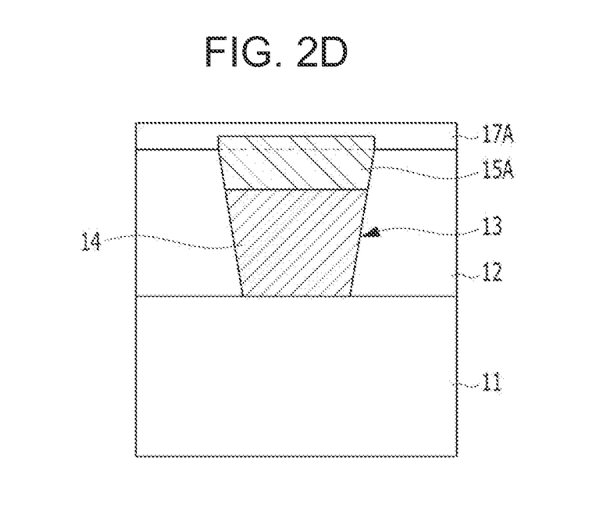

As shown in FIG. 2D, an annealing process is performed in a manner to reduce oxidized contact pad 16 to contact pad 15 and at the same time to convert reduced layer 17 to insulating layer 17A. After the completion of the annealing process, contact pad 15 may have an increased thickness. Contact pad 15 formed by reducing the oxidized contact pad is indicated by reference numeral 15A. Insulating layer 17A may be or include a metal-containing insulating layer containing or including the second metal. For example, insulating layer 17A may include a metal oxide layer formed by oxidizing the second metal-containing layer.

The annealing process may be performed by furnace thermal annealing or rapid thermal annealing at a temperature of about 400° C. to about 1000° C. In addition, the annealing process may be performed in two steps. First, a first-step annealing process may be performed in an inert gas atmosphere to reduce oxidized contact pad 16, which is in contact with reduced layer 17, to contact pad 15A. Herein, the reason why the annealing process is performed in the inert gas atmosphere is to more effectively induce a reduction reaction. Next, a second-step annealing process may be performed in an oxygen gas atmosphere to oxidize the remaining reduced layer 17 to form insulating layer 17A. This is to prevent characteristic degradation caused by reduced layer 17, e.g., short generation between contact pads 15A. Meanwhile, even when oxidized contact pad 16 remains after the first-step annealing process, the oxidized contact pad 16 is also reduced to contact pad 15A in the second-step annealing process. Thus, oxidized contact pad 16 can be completely removed.

Figure 2E:
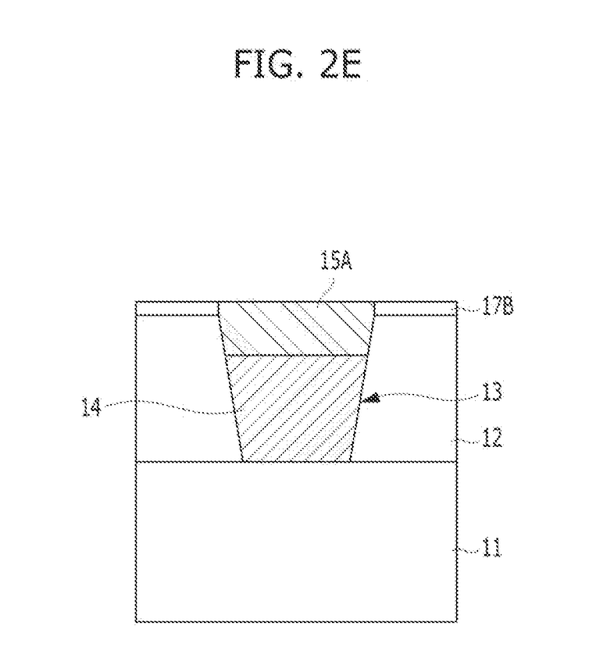

As shown in FIG. 2E, insulating layer 17A over contact pad 15A may be selectively etched to expose contact pad 15A. Etching process for exposing contact pad 15A may be performed by a dry etching or a wet etching. Dry etching may be performed by sputtering and wet etching may be performed using HF-based etchants. Hereinafter, etched insulating layer 17A will be indicated by a reference numeral '17B'.

An etching process for exposing contact pad 15A may be preformed such that insulating layer 17B remains over interlayer insulating layer 12 and thus, the surface of the insulating layer 17B is even with the surface of contact pad 15A. That is, etching may be performed in the manner that the thickness of overall insulating layer 17B may be reduced uniformly. This is to prevent the generation of step difference between contact pad 15A and interlayer insulating layer 12.

Figure 2F:
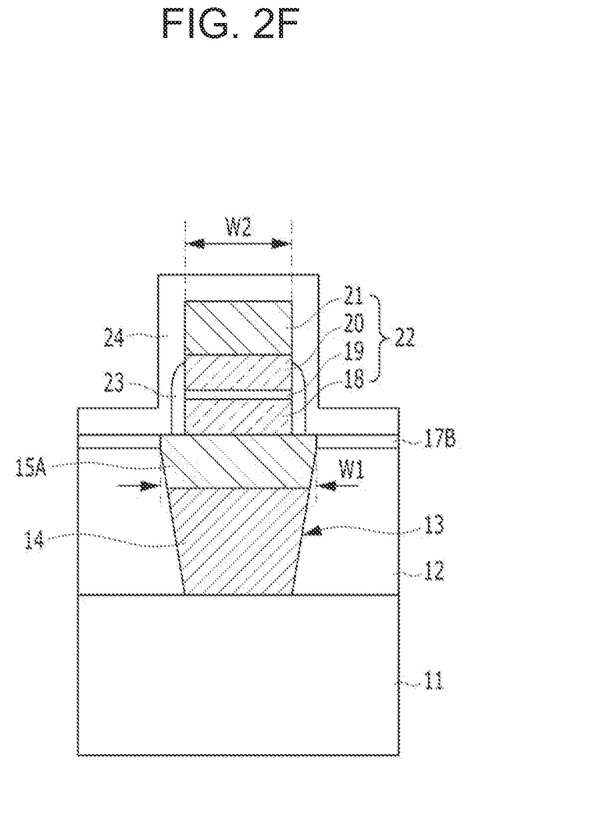

As shown in FIG. 2F, variable resistance element 22 is formed over contact pad 15A. Variable resistance element 22 is formed as a magnetic tunnel junction having a tunnel barrier 19 interposed between two magnetic materials. More specifically, variable resistance element 22 may be formed by forming a multilayer structure composed of or including first magnetic material 18, tunnel barrier 19, second magnetic material 20 and top electrode 21 that are deposited in that order, and then etching the multilayer structure using a mask pattern (not shown). At this time, in the process of forming variable resistance element 22 by etching the multilayer structure, spacer 23 may be formed by re-depositing etched insulating layer 17B on the sidewall of variable resistance element 22.

Variable resistance element 22 may overlap with contact pad 15A, and the width W2 of variable resistance element 22 may be smaller than the width W1 of contact pad 15A. In other words, variable resistance element 22 may be formed such that the whole variable resistance element 22 is located over contact pad 15A.

Next, capping layer 24 which covers the variable resistance element 22 including spacer 23 may be formed. Capping layer 24 may be formed of or include any one or a combination of two or more selected from the group consisting of or including an oxide layer, a nitride layer or an oxynitride layer.

An electronic device in accordance with the implementation may be completed through any additional process using available semiconductor fabrication technology.

According to the method for fabricating the electronic device in accordance with the above implementation, oxidized contact pad 16 over contact pad 15A is removed using reduced layer 17, and thus it is possible to prevent from degrading flatness of the surface of contact pad 15A and generating step difference between contact pad 15A and interlayer insulating layer 12. Therefore, the stability of the process for forming variable resistance element 22 and the characteristics of variable resistance element 22 can be increased.

As described above, according to the disclosed technology, the oxidized contact pad over the contact pad is removed using a reduced layer, and thus it is possible to prevent flatness degradation of the surface of the contact pad and the generation of step difference between the contact pad and interlayer insulating layer. In addition, because the electronic device has a metal-containing insulating layer formed by the conversion of the reduced layer, a low resistance contact pad can be easily realized, and the stability of a process of forming a variable resistance element, and the characteristics of the variable resistance element can be improved. Therefore, the reliability of the electronic device including the variable resistance element can be enhanced.

The semiconductor memory in accordance with the implementation of the present disclosure may be applied to diverse electronic devices or systems. FIGS. 3 to 7 show some examples of electronic devices or systems that can implement the semiconductor memory disclosed herein.

Figure 3:
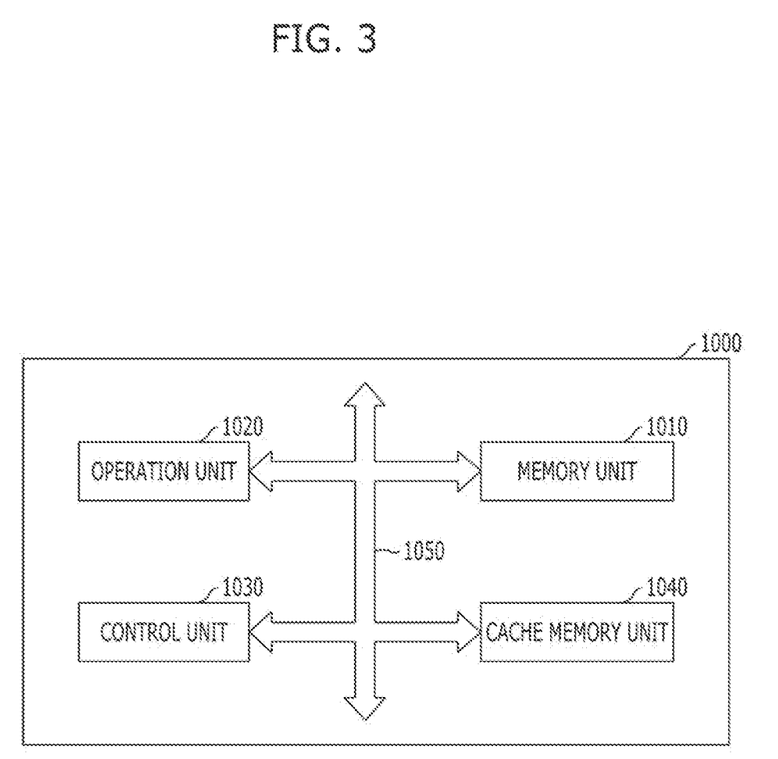
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. the memory unit 1010 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
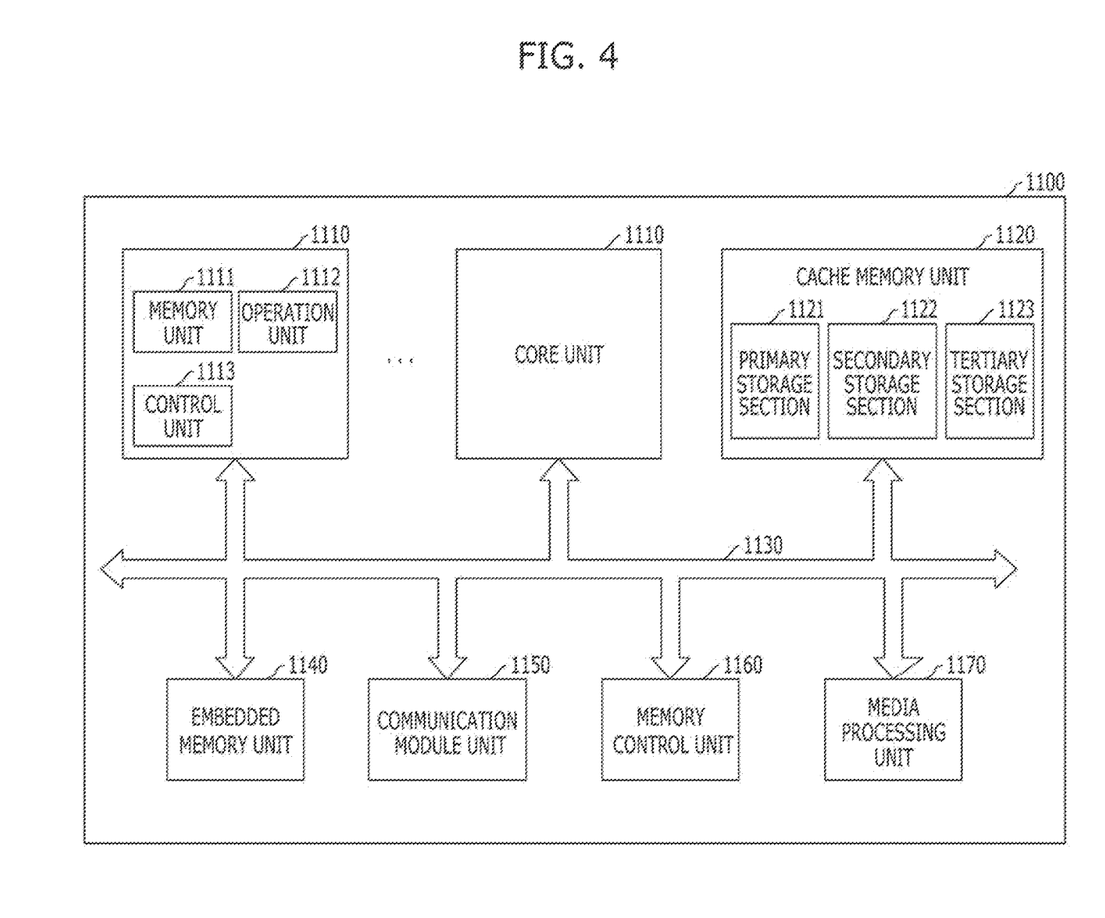
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the cache memory unit 1120 and the processor 1100 may have improved reliability.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
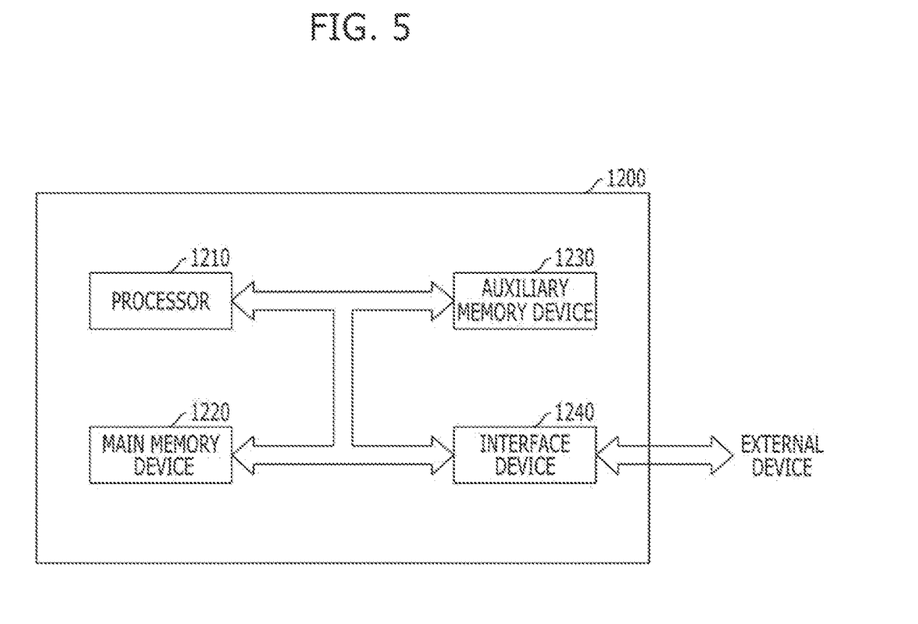
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the auxiliary memory device 1230 and the system 1200 may have improved reliability.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
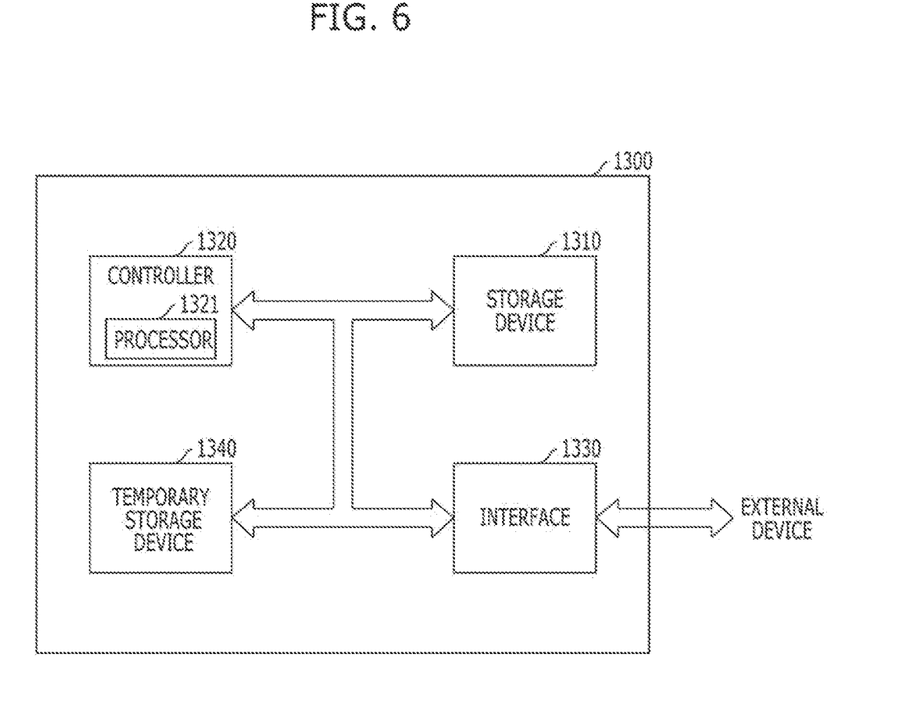
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the temporary storage device 1340 and the data storage system 1300 may have improved reliability.

Figure 7:
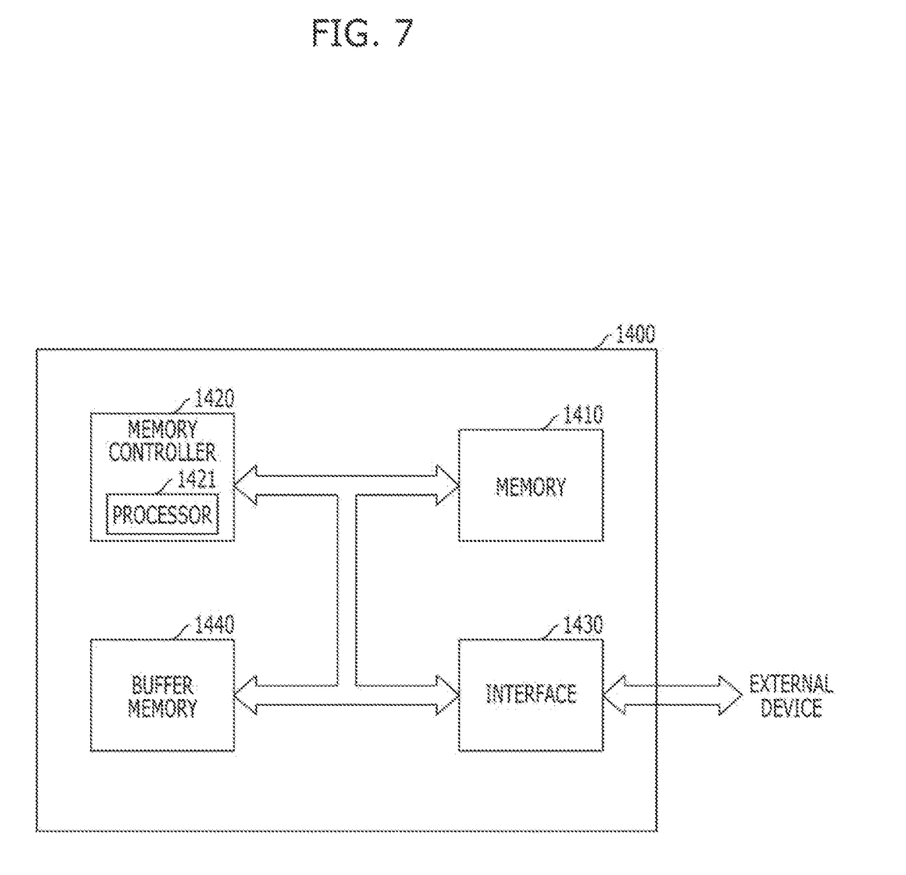
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a metal-containing insulating layer formed over an interlayer insulating layer over a substrate and containing a second metal; a contact hole formed through the interlayer insulating layer and the metal-containing insulating layer; a contact plug filling a portion of the contact hole; a contact pad formed over the contact plug so as to fill the remaining portion of the contact hole; and a variable resistance element formed over the contact pad, wherein the contact pad includes a metal-containing material containing a first metal, and the second metal has a higher electron affinity than the first metal. Because the electronic device has a metal-containing insulating layer, a low resistance contact pad can be easily realized, and the stability of a process of forming a variable resistance element, and the characteristics of the variable resistance element can be improved. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3 to 7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
    a substrate;
    an interlayer insulating layer formed over the substrate;
    a metal-containing insulating layer formed over the interlayer insulating layer and including a second metal;
    a contact hole formed through the interlayer insulating layer and the metal-containing insulating layer;
    a contact plug filling a portion of the contact hole;
    a contact pad formed over the contact plug so as to fill the remaining portion of the contact hole; and
    a variable resistance element formed over the contact pad,
    wherein the contact pad includes a metal-containing material including a first metal, and the second metal has a higher electron affinity than the first metal.

2. The electronic device of claim 1, further comprising a spacer on a sidewall of the variable resistance element.

3. The electronic device of claim 2, wherein the spacer comprises the same material as the metal-containing insulating layer.

4. The electronic device of claim 1, wherein the contact pad extended to have a protruding portion from the contact hole.

5. The electronic device of claim 1, wherein a sidewall of the contact plug is in contact with the interlayer insulating layer, and a sidewall of the contact pad is in contact with the interlayer insulating layer and the metal-containing insulating layer.

6. The electronic device of claim 1, wherein a width of the variable resistance element is smaller than that of the contact pad.

7. The electronic device of claim 1, wherein reactivity between the second metal and oxygen is greater than that between the first metal and oxygen.

8. The electronic device of claim 1, wherein the first metal includes a transition metal, and the second metal includes an amphoteric element or a lanthanoid element.

9. The electronic device of claim 1, wherein the variable resistance element includes a magnetic tunnel junction having a tunnel barrier interposed between two magnetic materials.

10. The electronic device of claim 1, wherein the variable resistance element includes a metal oxide, a phase-change material or a ferroelectric material.

11. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

12. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

13. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside, wherein the semiconductor memory is part of the auxiliary memory device or the main memory device in the processing system.

14. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside, wherein the semiconductor memory is part of the storage device or the temporary storage device in the data storage system.

15. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside, wherein the semiconductor memory is part of the memory or the buffer memory in the memory system.

* * * * *